(12) United States Patent
van Schravendijk et al.

(10) Patent No.: US 8,133,797 B2
(45) Date of Patent: Mar. 13, 2012

(54) PROTECTIVE LAYER TO ENABLE DAMAGE FREE GAP FILL

(75) Inventors: Bart van Schravendijk, Sunnyvale, CA (US); Richard S. Hill, Atherton, CA (US); Wilbert van den Hoek, Saratoga, CA (US); Harald te Nijenhuis, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 186 days.

(21) Appl. No.: 12/122,614

(22) Filed: May 16, 2008

(65) Prior Publication Data

US 2009/0286381 A1 Nov. 19, 2009

(51) Int. Cl.
*H01L 21/76* (2006.01)
(52) U.S. Cl. .......... 438/427; 438/296; 257/E21.548
(58) Field of Classification Search .......... 438/424, 438/427, 694, 702, 435, 437, 296, 221, 761; 257/E21.546, E21.548, 758, E21.545
See application file for complete search history.

(56) References Cited

U.S. PATENT DOCUMENTS

| | | |
|---|---|---|
| 4,361,461 A | 11/1982 | Chang |
| 5,129,958 A | 7/1992 | Nagashima et al. |
| 5,227,191 A | 7/1993 | Nagashima |
| 5,246,885 A | 9/1993 | Braren et al. |
| 5,252,178 A | 10/1993 | Moslehi |
| 5,270,264 A | 12/1993 | Andideh et al. |
| 5,282,925 A | 2/1994 | Jeng et al. |
| 5,342,801 A | 8/1994 | Perry et al. |
| 5,385,857 A | 1/1995 | Solo de Zaldlvar |
| 5,494,854 A | 2/1996 | Jain |
| 5,516,729 A | 5/1996 | Dawson et al. |
| 5,532,516 A | 7/1996 | Pasch et al. |
| 5,621,241 A | 4/1997 | Jain |
| 5,622,894 A | 4/1997 | Jang et al. |

(Continued)

FOREIGN PATENT DOCUMENTS

JP 2003-031649 1/2003

OTHER PUBLICATIONS

U.S. Office Action mailed Aug. 6, 2003, from U.S. Appl. No. 10/058,897.

(Continued)

*Primary Examiner* — Matthew Landau
*Assistant Examiner* — Latanya N Crawford
(74) *Attorney, Agent, or Firm* — Weaver Austin Villeneuve & Sampson LLP

(57) ABSTRACT

In-situ semiconductor process that can fill high aspect ratio (typically at least 6:1, for example 7:1 or higher), narrow width (typically sub 0.13 micron, for example 0.1 micron or less) gaps without damaging underlying features and little or no incidence of voids or weak spots is provided. A protective layer is deposited to protect underlying features in regions of the substrate having lower feature density so that unwanted material may be removed from regions of the substrate having higher feature density. This protective layer may deposits thicker on a low density feature than on a high density feature and may be deposited using a PECVD process or low sputter/deposition ratio HDP CVD process. This protective layer may also be a metallic oxide layer that is resistant to fluorine etching, such as zirconium oxide ($ZrO_2$) or aluminum oxide ($Al_2O_3$).

23 Claims, 7 Drawing Sheets

U.S. PATENT DOCUMENTS

| | | | |
|---|---|---|---|
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |
| 5,851,344 A | 12/1998 | Xu et al. | |
| 5,858,876 A | 1/1999 | Chew | |
| 5,869,902 A | 2/1999 | Lee et al. | |
| 5,872,058 A | 2/1999 | Van Cleemput et al. | |
| 5,897,370 A | 4/1999 | Joshi et al. | |
| 5,910,020 A | 6/1999 | Yamada | |
| 5,911,113 A | 6/1999 | Yao et al. | |
| 5,913,140 A | 6/1999 | Roche et al. | |
| 5,920,792 A | 7/1999 | Lin | |
| 5,937,323 A | 8/1999 | Orezyk et al. | |
| 5,953,635 A | 9/1999 | Andideh | |
| 5,962,923 A | 10/1999 | Xu et al. | |
| 5,963,840 A | 10/1999 | Xia et al. | |
| 5,968,610 A * | 10/1999 | Liu et al. | 438/435 |
| 5,972,192 A | 10/1999 | Dubin et al. | |
| 6,027,663 A | 2/2000 | Martin et al. | |
| 6,030,881 A | 2/2000 | Papasouliotis et al. | |
| 6,037,018 A | 3/2000 | Jang et al. | |
| 6,077,451 A | 6/2000 | Takenaka et al. | |
| 6,077,574 A | 6/2000 | Usami | |
| 6,100,205 A | 8/2000 | Liu et al. | |
| 6,106,678 A | 8/2000 | Shufflebotham et al. | |
| 6,124,211 A | 9/2000 | Butterbaugh et al. | |
| 6,136,703 A | 10/2000 | Vaartstra | |
| 6,149,779 A | 11/2000 | Van Cleemput | |
| 6,184,158 B1 | 2/2001 | Shufflebotham et al. | |
| 6,200,412 B1 * | 3/2001 | Kilgore et al. | 156/345.28 |
| 6,211,065 B1 | 4/2001 | Xi et al. | |
| 6,232,196 B1 | 5/2001 | Raaijmakers et al. | |
| 6,265,269 B1 | 7/2001 | Chen et al. | |
| 6,277,764 B1 | 8/2001 | Shin et al. | |
| 6,331,494 B1 | 12/2001 | Olson et al. | |
| 6,335,261 B1 | 1/2002 | Natzle et al. | |
| 6,395,150 B1 | 5/2002 | Van Cleemput et al. | |
| 6,400,023 B2 | 6/2002 | Huang | |
| 6,410,446 B1 | 6/2002 | Tsai et al. | |
| 6,429,149 B1 * | 8/2002 | Chakravarti et al. | 438/787 |
| 6,451,705 B1 | 9/2002 | Trapp et al. | |
| 6,479,361 B1 | 11/2002 | Park | |
| 6,479,396 B1 | 11/2002 | Xu et al. | |
| 6,482,716 B1 * | 11/2002 | Wohlfahrt | 438/427 |
| 6,486,081 B1 | 11/2002 | Ishikawa et al. | |
| 6,500,728 B1 | 12/2002 | Wang | |
| 6,531,377 B2 | 3/2003 | Knorr et al. | |
| 6,566,229 B2 | 5/2003 | Hong et al. | |
| 6,569,777 B1 | 5/2003 | Hsu et al. | |
| 6,596,653 B2 | 7/2003 | Tan et al. | |
| 6,596,654 B1 | 7/2003 | Bayman et al. | |
| 6,599,829 B2 | 7/2003 | Smith et al. | |
| 6,617,207 B1 | 9/2003 | Kiryu et al. | |
| 6,642,105 B2 | 11/2003 | Kim et al. | |
| 6,706,541 B1 | 3/2004 | Toprac et al. | |
| 6,737,334 B2 * | 5/2004 | Ho et al. | 438/424 |
| 6,787,483 B1 | 9/2004 | Bayman et al. | |
| 6,794,290 B1 | 9/2004 | Papasouliotis et al. | |
| 6,808,748 B2 | 10/2004 | Kapoor et al. | |
| 6,812,043 B2 | 11/2004 | Bao et al. | |
| 6,821,905 B2 * | 11/2004 | Pan et al. | 438/706 |
| 6,846,391 B1 | 1/2005 | Papasouliotis et al. | |
| 6,846,745 B1 | 1/2005 | Papasouliotis et al. | |
| 6,852,639 B2 | 2/2005 | Rudolph et al. | |
| 6,867,086 B1 * | 3/2005 | Chen et al. | 438/219 |
| 6,903,031 B2 | 6/2005 | Karim et al. | |
| 6,958,112 B2 | 10/2005 | Karim et al. | |
| 7,001,854 B1 | 2/2006 | Papasouliotis et al. | |
| 7,067,440 B1 | 6/2006 | Bayman et al. | |
| 7,078,312 B1 | 7/2006 | Sutanto et al. | |
| 7,097,886 B2 * | 8/2006 | Moghadam et al. | 427/569 |
| 7,122,485 B1 | 10/2006 | Papasouliotis et al. | |
| 7,135,409 B2 | 11/2006 | Komagata | |
| 7,148,155 B1 | 12/2006 | Tarafdar et al. | |
| 7,163,896 B1 | 1/2007 | Zhu et al. | |
| 7,176,039 B1 | 2/2007 | Papasouliotis et al. | |
| 7,205,240 B2 | 4/2007 | Karim et al. | |
| 7,211,525 B1 | 5/2007 | Shanker et al. | |
| 7,217,658 B1 | 5/2007 | Bayman et al. | |
| 7,344,996 B1 | 3/2008 | Lang et al. | |
| 7,358,190 B2 * | 4/2008 | Kim et al. | 438/694 |
| 7,364,975 B2 * | 4/2008 | Culmsee et al. | 438/296 |
| 7,381,451 B1 | 6/2008 | Lang et al. | |
| 7,476,621 B1 | 1/2009 | Nguyen et al. | |
| 7,482,245 B1 | 1/2009 | Yu et al. | |
| 2001/0001175 A1 | 5/2001 | Narwankar et al. | |
| 2001/0019903 A1 | 9/2001 | Shufflebotham et al. | |
| 2001/0044203 A1 | 11/2001 | Huang et al. | |
| 2002/0040764 A1 * | 4/2002 | Kwan et al. | 156/345 |
| 2002/0052119 A1 | 5/2002 | Van Cleemput | |
| 2002/0084257 A1 | 7/2002 | Bjorkman et al. | |
| 2002/0153550 A1 * | 10/2002 | An et al. | 257/301 |
| 2002/0179570 A1 | 12/2002 | Mathad et al. | |
| 2002/0187657 A1 | 12/2002 | Morozumi | |
| 2003/0003244 A1 | 1/2003 | Rossman | |
| 2003/0003682 A1 | 1/2003 | Moll et al. | |
| 2003/0087506 A1 | 5/2003 | Kirchhoff | |
| 2003/0165632 A1 | 9/2003 | Lin et al. | |
| 2003/0203652 A1 | 10/2003 | Bao et al. | |
| 2003/0207580 A1 | 11/2003 | Li et al. | |
| 2004/0020894 A1 | 2/2004 | Williams et al. | |
| 2004/0058549 A1 * | 3/2004 | Ho et al. | 438/694 |
| 2004/0082181 A1 | 4/2004 | Doan et al. | |
| 2004/0110390 A1 | 6/2004 | Takagi et al. | |
| 2004/0241342 A1 | 12/2004 | Karim et al. | |
| 2005/0074946 A1 | 4/2005 | Chu et al. | |
| 2005/0130411 A1 | 6/2005 | Bao et al. | |
| 2005/0136576 A1 | 6/2005 | Ishihara et al. | |
| 2005/0136686 A1 | 6/2005 | Kim et al. | |
| 2005/0250346 A1 | 11/2005 | Schmitt | |
| 2005/0255667 A1 | 11/2005 | Arghavani et al. | |
| 2006/0183296 A1 * | 8/2006 | Yoo et al. | 438/424 |
| 2006/0275984 A1 * | 12/2006 | Liu et al. | 438/257 |
| 2007/0054504 A1 | 3/2007 | Chen et al. | |
| 2007/0059898 A1 * | 3/2007 | Shin et al. | 438/424 |
| 2007/0204907 A1 | 9/2007 | Strang | |
| 2009/0286381 A1 | 11/2009 | van Schravendijk et al. | |

OTHER PUBLICATIONS

U.S. Office Action mailed Jan. 29, 2004, from U.S. Appl. No. 10/058,897.
U.S. Office Action mailed May 21, 2004, from U.S. Appl. No. 10/058,897.
U.S. Office Action mailed Aug. 10, 2004, from U.S. Appl. No. 10/271,333.
U.S. Office Action mailed Apr. 14, 2005, from U.S. Appl. No. 10/271,333.
U.S. Office Action mailed Jun. 29, 2005, from U.S. Appl. No. 10/728,569.
Guari et al., "Method of Preventing Structures Erosion During Multi-Step Gap Fill", Novellus Systems, Inc., filed Dec. 4, 2003, U.S. Appl. No. 10/728,569, pp. 1-29.
U.S. Office Action mailed Jan. 7, 2005, from U.S. Appl. No. 10/728,569.
U.S. Office Action mailed Nov. 6, 2002, from U.S. Appl. No. 09/996,619.
U.S. Office Action mailed Mar. 2, 2004, from U.S. Appl. No. 10/442,846.
U.S. Office Action mailed Jul. 25, 2005, from U.S. Appl. No. 10/890,655.
U.S. Office Action mailed Apr. 30, 2004, from U.S. Appl. No. 10/389,164.
U.S. Office Action mailed Jun. 17, 2004, from U.S. Appl. No. 10/654,113.
U.S. Office Action mailed Dec. 2, 2004, from U.S. Appl. No. 10/654,113.
U.S. Office Action mailed Mar. 31, 2005, from U.S. Appl. No. 10/654,113.
Hook et al., "The Effects of Fluorine on Parametrics and Reliability in a 0.18-μm 3.5/6.8 nm Dual Gate Oxide CMOS Technology", IEEE Transactions on Electron Devices, vol. 48, No. 7., Jul. 2001, pp. 1346-1353.

U.S. Office Action mailed Jan. 27, 2005, from U.S. Appl. No. 10/316,987.
U.S. Office Action mailed Jul. 14, 2005, from U.S. Appl. No. 10/316,987.
U.S. Office Action mailed Apr. 19, 2005, from U.S. Appl. No. 10/733,858.
U.S. Office Action mailed Oct. 7, 2005, from U.S. Appl. No. 10/733,858.
Lang et al., "Helium-Based Etch Process in Deposition-Etch-Deposition Gap Fill", Novellus Systems, Inc., filed Jun. 22, 2005, U.S. Appl. No. 11/159,834, pp. 1-29.
U.S. Office Action mailed Nov. 17, 2005, from U.S. Appl. No. 10/316,987.
Lang et al., "Strain Engineering—HDP Thin Film With Tensile Stress for FEOL and Other Applications", Novellus Systems, Inc., filed Nov. 17, 2004, U.S. Appl. No. 10/991,890, pp. 1-35.
U.S. Office Action mailed Oct. 18, 2005, from U.S. Appl. No. 10/947,424.
Lang et al., "Using Water (H20) to Replace Oxygen (02) in a Silicon Dioxide (Si02) Thin Film Deposition Process for HDP STI Technology", Novellus Systems, Inc., filed Nov. 9, 2005, U.S. Appl. No. 11/272,487, pp. 1-25.
U.S. Office Action mailed Dec. 14, 2005, from U.S. Appl. No. 10/728,569.
Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.
U.S. Office Action mailed Feb. 16, 2006, from U.S. Appl. No. 11/082,369.
U.S. Office Action mailed Mar. 24, 2006, from U.S. Appl. No. 10/733,858.
U.S. Office Action mailed Jun. 1, 2006, from U.S. Appl. No. 10/728,569.
U.S. Office Action mailed Apr. 19, 2006, from U.S. Appl. No. 10/947,424.
U.S. Office Action mailed Sep. 29, 2006, from U.S. Appl. No. 11/082,369.
U.S. Office Action mailed Oct. 2, 2006, from U.S. Appl. No. 10/935,909.
Yu et al., "Stress Profile Modulation in STI Gap Fill," Novellus Systems, Inc., U.S. Appl. No. 11/471,958, filed Jun. 20, 2006, pp. 1-27.
U.S. Office Action mailed May 9, 2007, from U.S. Appl. No. 10/991,890.
U.S. Office Action mailed May 16, 2007, from U.S. Appl. No. 11/159,834.
U.S. Office Action mailed Nov. 19, 2007, from U.S. Appl. No. 10/728,569.
U.S. Office Action mailed Nov. 2, 2007, from U.S. Appl. No. 10/991,890.
U.S. Office Action mailed Oct. 17, 2007, from U.S. Appl. No. 11/159,834.
Notice of Allowance mailed Dec. 13, 2007, from U.S. Appl. No. 11/159,834.
Allowed Claims from U.S. Appl. No. 11/159,834.
U.S. Office Action mailed Jan. 8, 2008, from U.S. Appl. No. 11/366,220.
U.S. Office Action mailed May 16, 2008, from U.S. Appl. No. 10/728,569.
U.S. Office Action mailed Jun. 11, 2008, from U.S. Appl. No. 11/471,958.
U.S. Office Action mailed Jun. 27, 2008, from U.S. Appl. No. 11/366,220.
U.S. Final Office Action mailed Jul. 31, 2008, from U.S. Appl. No. 11/366,220.
Notice of Allowance mailed Jan. 31, 2008, from U.S. Appl. No. 10/991,890.
Allowed Claims from U.S. Appl. No. 10/991,890.
Notice of Allowance mailed Sep. 9, 2008, from U.S. Appl. No. 11/366,220.
Allowed Claims from U.S. Appl. No. 11/366,220.
Notice of Allowance mailed Sep. 30, 2008, from U.S. Appl. No. 11/471,958.
Allowed Claims from U.S. Appl. No. 11/471,958.
U.S. Appl. No. 11/272,487, Office Action mailed Feb. 9, 2009.
U.S. Appl. No. 10/728,569, Office Action mailed Apr. 6, 2009.
U.S. Appl. No. 10/728,569, Office Action mailed Oct. 14, 2009.
U.S. Appl. No. 11/671,510, Final Office Action mailed Aug. 9, 2010.

* cited by examiner

PROTECTIVE LAYER TO ENABLE DAMAGE FREE GAP FILL

FIELD OF THE INVENTION

This invention relates to electronic device fabrication processes and associated apparatus. More specifically, the invention relates to chemical vapor deposition and dry etch processes for forming dielectric layers, particularly in substrates having high density and isolated feature regions.

BACKGROUND OF THE INVENTION

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width (e.g. less than 0.13 µm gap width), high aspect ratio (AR) features (e.g., AR>6:1) becomes increasingly difficult due to limitations of existing deposition processes.

High density plasma (HDP) chemical vapor deposition (CVD), a directional (bottom-up) CVD process, is the method currently used for high aspect ratio gapfill. HDP CVD deposits more material at the bottom of a high aspect ratio structure than on its sidewalls. It accomplishes this by directing dielectric precursor species downward, to the bottom of the gap while simultaneously removing deposited material from the trench top through sputtering by the use of biased RF power applied to the substrate. Thus, HDP CVD is not an entirely diffusion-based or isotropic process.

However, HDP CVD gapfill results in the formation of cusps, also known as overhangs, at the entry region of the gap to be filled. These formations result from sputtering and redeposition processes. The directional aspect of the deposition process produces some high momentum charged species that sputter away material from within the gap. The sputtered material tends to redeposit on the sidewalls of high AR structures. As a result, the entry region of a high aspect ratio structure may close before bottom-up fill has been completed, leaving voids or weak spots within the structure. This phenomenon, known as "pinch-off," is exacerbated in narrow features. The overhangs cannot be totally eliminated because non-directional reactions of neutral species and sputtering and redeposition reactions are inherent to the physics and chemistry of the HDP CVD processes.

Furthermore, as aspect ratios increase, the shape of the gap itself can contribute to the problem. High aspect ratio gaps often exhibit reentrant features, which make gap filling even more difficult. The most problematic reentrant feature is a narrowing at the top of the gap, wherein the side-walls slope inward near the top of the gap. For a given aspect ratio feature, this increases the ratio of gap volume to be filled to gap entry area seen by the precursor species during deposition. Hence voids or weak spots become even more likely.

In addition to undesirable formations inside the feature, a peak of dielectric material often called a "top hat" forms on the top surface of the substrate on either side of the features. Top hats are deposits of material in the shape of a peak that slopes downwards towards the entry to the gap. If not removed, the top hats are an additional source of redeposition species that increase the rate of overhang growth, thereby effectively making the aspect ratio of the gap even higher.

In some gap fill applications, particularly in the case of small features with high aspect ratios, a multi-step deposition/ etch back process has been used in order to remove the overhangs, reduce the top hats, and facilitate void-free gap fill. For example, a deposition and etch process utilizing HDP CVD deposition and an aqueous HF dip for the etch back step has been used. However, this requires that the wafers be cycled between the plasma deposition system and the wet etch back system for a number of cycles. This results in a long cycle time and correspondingly large capital investment to run the multiple steps for gap fill.

In-situ multi-step plasma deposition/etch processes have also been used to keep the entry to the gap from closing before it is filled. Such in-situ HDP CVD deposition and etch back processes are described, for example, in U.S. Pat. Nos. 7,163,896, 6,030,881, 6,395,150, and 6,867,086, the disclosures of which are incorporated herein by reference for all purposes. Some of these in-situ plasma etch back processes use high-energy ions to create a significantly anisotropic sputter etch. Other in-situ plasma etch back processes use chemically-reactive etch gases (e.g., nitrogen trifluoride, $NF_3$) to create a significantly isotropic plasma etch.

In many instances, these sputter etch and reactive plasma etch processes damage the underlying structure of the features on the substrate. It should be noted that once the gap is re-opened by the etch process, the oxide fill material on the sidewalls and at the bottom of the trench is also exposed to the etch reaction. For instance, if a significantly isotropic plasma etch step is used, the upper sidewalls of the structure may be eroded and the etch step may remove nearly as much material as was deposited in the previous etch step. If the underlying structure is eroded via one of these chemical or physical pathways, it can result in compromised device performance (such as higher leakage current). Thus it is desirable to reduce erosion of the underlying structure during the gap fill operations.

Device designs typically have regions of differing feature density on the substrate. There may be one or more regions with high density of features and one or more regions with isolated features. These regions of differing feature density respond to deposition and etch processes differently, often resulting in varying degrees of gap fill. Regions having a high density of features are more susceptible to pinch-off because of their relatively higher aspect ratios. Thus the dense features generally define the maximum amount of deposition before requiring an etch step. They may similarly also define the amount of etch necessary to remove the overhangs at the entry of the gap and reopen the gap. The amount of etch required to remove cusp material from regions having high density of features may however result in over-etch of regions having isolated features. This can result in severe damage to the underlying structure in isolated features. Reduced etching would protect the isolated features but would increase the number of deposition/etch operations necessary to completely fill a gap or in more severe cases void formation could result. Thus, it is desirable to develop more advanced etch processes that can remove the overhang material without damaging the underlying features across regions with dense and isolated features.

While these in-situ multi-step deposition and etch back processes have improved high aspect ratio gap fill capabilities, dielectric deposition processes that can reliably fill high aspect ratio features of narrow width, particularly very small features (e.g., less than about 0.1 µm gap width) with aspect ratios of about 6:1 or more, without leaving voids, continue to be sought. It is even more difficult to uniformly fill high aspect ratio features on a substrate that contains regions of differing feature density. A method to reliably fill both dense and isolated features with fewer operations and without causing detrimental damage to the underlying structure is still needed.

SUMMARY OF THE INVENTION

The present invention pertains to an in-situ semiconductor process that can fill high aspect ratio (typically at least 6:1, for example 7:1 or higher), narrow width (typically sub 0.13 micron, for example 0.1 micron or less) gaps on a substrate that contains regions of differing feature density without damaging underlying structures. The fill should have little or no incidence of voids, seams or weak spots. A sequence of several deposition and etching process operations may be performed to completely fill a gap.

The process has fewer operations than prior processes, thereby increasing throughput. A protective layer is deposited to protect underlying features in regions of the substrate having isolated features so that unwanted material may be removed from regions of the substrate having high density of features. This protective layer may deposit thicker on the isolated feature than on a dense feature and may, for instance, be deposited using a plasma-enhanced chemical vapor deposition (PECVD) process or low sputter/deposition ratio HDP CVD process.

In one aspect, the present invention pertains to a semiconductor processing method for high-aspect ratio gapfill. A substrate having a region of high feature density and a region of lower feature density is provided. "High density" or "dense" features refer to features in the region of high feature density, and "low density" features and isolated features refer to features in the region of lower feature density. Features may be gaps or structures adjacent to the gaps. High density features may be closely packed (typically at or close to the minimum lithographic dimension) gaps with high aspect-ratios and adjacent structures, for example, as region 126 in FIG. 1A. Lower density features may be loosely packed gaps that may have lower aspect-ratios than the high density gaps, for example, less than 0.5, as region 128 in FIG. 1A. A protective layer may be deposited on the substrate over all features before a dielectric layer is deposited to partially fill the high-aspect ratio gaps. The substrate is etched to reduce the aspect-ratio of the gaps in the high feature density region. The dielectric layer deposition may cause formation of an overhang structure that partially blocks the gap opening, which is removed by the etch. The protective layer prevents excessive removal of an underlying structure of the features in the low feature density region during the etching. The remaining gap may be completely filled by a final dielectric layer deposition.

In some embodiments, the depositing of protective and dielectric layers and etching operations are repeated before the final dielectric layer, sometimes called a capping layer, is deposited. In other embodiments, only the depositing of dielectric layer and etching operations are repeated before the final dielectric layer is deposited. The protective layer may be deposited after an initial deposition of the dielectric layer, in some cases. In those cases, the depositing of dielectric and protective layers and etching operations may be repeated before the capping layer is deposited. Use of a protective layer preferably reduces the number of deposition/etch operations by at least 50% than if no protective layer is used under the same deposition conditions. The depositing and etching operations may occur in the same semiconductor processing tool and may even occur in the same chamber.

In certain embodiments, the protective layer may be a dielectric layer that deposits thicker in gaps in the low density region (isolated features) than in gaps in the high density region. The protective layer may be deposited using a PECVD process or a HDP CVD process having a lower sputter-deposition ratio, e.g., less than about 0.2, preferably less than about 0.15. In other words, the rate of etching during the HDP CVD process is 15% or less of the rate of deposition. The process conditions in the HDP CVD chamber may mimic that of the PECVD process. The pressure may be higher, bias and source power may be lower, and the substrate temperature may be lower than that of the conventional HDP CVD process. The protective layer may have a wet etch rate that is comparable to the wet etch rate of a thermally grown silicon oxide.

In other embodiments, the protective layer may be a dielectric layer that has high resistance to fluorine etching. The dielectric layer may comprise one or more layers of metallic oxide or nitride. The protective layer may be chosen to be compatible with operation of a semiconductor device to be created. The metallic oxide may include a zirconium oxide ($ZrO_2$), or an aluminum oxide ($Al_2O_3$). A suitable nitride may be a boron nitride (BN). The zirconium oxide may be deposited using an atomic layer deposition (ALD) process and the aluminum oxide may be deposited using a pulsed deposition layer (PDL) or an ALD process.

In certain embodiments, more than one type of protective layers may be used. A first protective layer may be a dielectric layer that has high resistance to fluorine etching. A second protective layer may be a dielectric layer that deposits thicker in gaps in the low density region (isolated features) than in gaps in the high density region. The first protective layer may be a transition-metal oxide and be deposited under the gapfill dielectric.

In another aspect, the present invention pertains to a semiconductor processing method to protect structures underlying isolated features during etching. The method includes providing a substrate having a region of high feature density and a region of lower feature density; depositing a protective layer over the features; depositing a dielectric layer to partially fill the high-aspect ratio features; etching the substrate to remove deposition from the surface and sidewalls to reduce the aspect-ratio of the features in the high feature density region; and, depositing a final dielectric layer to completely fill the feature. The dielectric deposition may form overhangs that partially block the opening before the overhang is removed by the etch. The etch operation also removes some or all of the protective layer, but removes little or no bottom fill, and does not excessively remove the underlying structures.

These and other features and advantages of the present invention are described below with reference to the drawings.

DETAILED DESCRIPTION OF THE PRESENT INVENTION

In the following detailed description of the present invention, a number of specific embodiments are set forth in order to provide a thorough understanding of the invention. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In some descriptions herein, well-known processes, procedures, and components have not been described in detail so as not to unnecessarily obscure aspects of the present invention. For example, the present invention applies to a substrate having gaps in need of being filled by dielectric material. The invention is not, however, limited to such applications. It may be employed in a myriad of other fabrication processes such as for fabricating flat panel displays.

In this application, the terms "wafer" and "substrate"; terms "substrate support" and "pedestal"; and terms "gap" and "trench" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as display backplanes, printed circuit boards and the like.

Introduction

This invention finds particular value in integrated circuit fabrication. The gap filling processes are performed on partially fabricated integrated circuits employing semiconductor substrates. In specific examples, the gap filling processes of this invention are employed to form shallow trench isolation (STI), intermetal dielectric (IMD) layers, interlayer dielectric (ILD) layers, pre-metal dielectric (PMD) layers, passivation layers, etc.

Figure 1A:
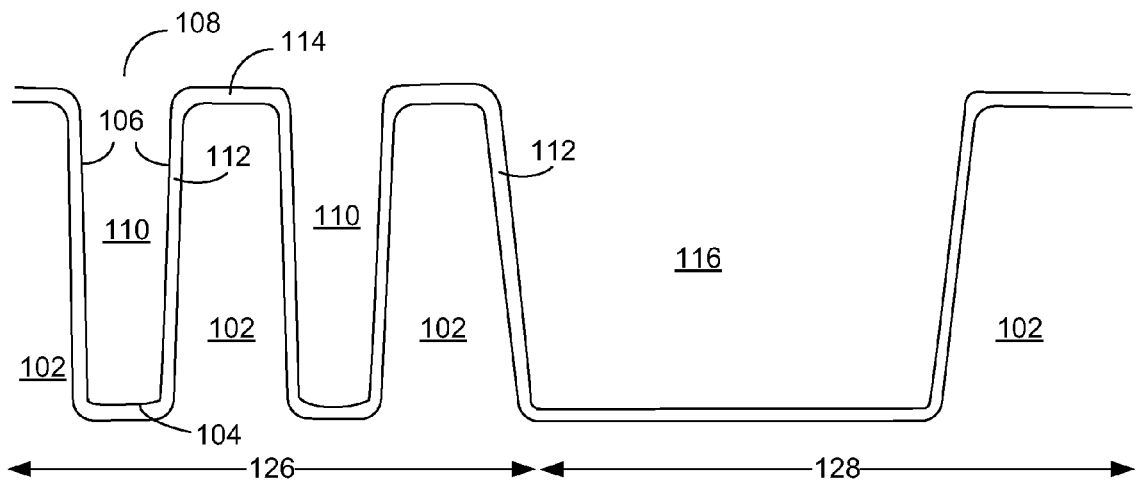
FIGS. 1A-H depict rough schematic cross-sectional diagrams of a multi-step gap fill process in accordance with the present invention.

Most device designs have regions of variable feature density on the substrate. There may be one or more regions with high feature density and one or more regions with isolated features, or low feature density. These devices may be memory or logic or both. Dense regions include structures that are closely packed together, with high aspect-ratio trenches. Isolated regions include structures that are not so closely packed together, with lower aspect-ratio trenches. FIG. 1A shows a cross-sectional diagram of a partially fabricated substrate containing dense regions (126) and isolated regions (128). Even though the geometries of trenches in dense and isolated regions are very different, trench filling operations still must be able to fill both geometries at the same time. Usually, fine-tuned process parameters optimized for filling of one type of trench may be unsuitable for the other, while compromise process parameters work for both at a cost to efficiency and throughput.

The present invention pertains to a multi-step process comprising high-density plasma chemical vapor deposition (HDP CVD) of a dielectric layer, deposition of a protective layer, and subsequent etch back. The process can fill high aspect ratio (typically at least 6:1, for example 7:1 or higher), narrow width (typically sub 0.13 micron, for example 0.1 micron or less) gaps in dense regions with significantly reduced incidence of voids or weak spots and at the same time fill lower aspect-ratio (typically less than 1:1), wide gaps in isolated regions without damaging, or excess removal of, the underlying structures.

This HDP CVD part of the process may involve the use of any suitable HDP CVD chemistry, including those with hydrogen and dopant precursors in the reactive mixture. The dielectrics employed to fill those gaps will often be a silicon oxide such as silicon dioxide, silicon oxynitride, silicon oxyfluoride, and doped variants of these. Therefore, the invention includes at least phosphorus-doped, boron-doped, fluorine-doped, carbon-doped silicon dioxide, silicon oxynitride, and silicon oxyfluoride. The invention also includes combinations of these dopants listed in a silicon oxide. Thus, the dielectric may also be a boron- and phosphorus-silicon oxide glass (BPSG). Generally, a high density plasma is any plasma having a high concentration of free electrons and, hence, a high concentration of ions. A typical electron density in a high density plasma is in the range of $1\times10^{11}$ electron per cubic centimeter or higher depending on gases in the chamber and power level used. Typically, though not necessarily, high density plasma reactors operate at relatively low pressures, in the range of 100 mTorr or lower.

The protective layer deposition part of the process involves depositing a layer of material to protect materials at the corners of trenches in isolated regions. The protective layer may be deposited before or after each HDP CVD deposition, or only once at the beginning of the entire gapfill process. In certain embodiments, the protective layer deposits thicker in isolated regions than dense regions or is especially resistant to subsequent etch. The protective layer may be a similar material as deposited in the HDP CVD operation deposited using a PECVD process or low sputter/deposition ratio HDP CVD process. This protective layer may be a metallic oxide layer that is resistant to fluorine etching, such as zirconium oxide ($ZrO_2$) or aluminum oxide ($Al_2O_3$). The protective layer also preferably have a wet etch rate that is comparable to the wet etch rate of a thermally grown silicon oxide. Preferably, the wet etch rate may differ by less than 25%, preferably less than 15%.

The etch back part of the process involves a significantly isotropic reactive plasma etch or chemical dry etch. The reactive plasma etch may comprise a high density plasma or a downstream plasma, powered by, for example, microwave or radio frequency (RF) energy. Suitable plasma reactors with in-situ and/or downstream plasma sources are available to accomplish the etch process.

This multi-step process sequence of dielectric deposition, protective layer deposition and etch back may be repeated more than one time to achieve a fully-filled feature. All of the methods of the present invention may be performed in a single semiconductor processing tool consisting of single or multiple modules. A single module may consist of a single station or multiple stations dedicated to different operations of the process. Integrating all the steps in the same tool increases throughput and reduces handling of wafers resulting in more efficient and higher quality gap fill operations. The methods of the present invention may also be performed in more than one semiconductor processing tool.

Multi-Step Deposition and Etch Back Process

FIGS. 1A-H depict rough schematic cross-sectional diagrams of a multi-step deposition and etch back gap fill process in accordance with the present invention. FIG. 1A depicts gaps (trenches) 110/116 on a semiconductor substrate requiring filling with a dielectric. Gaps 110 depict high density features; and gap 116 depicts a low density feature, or isolated feature. Gaps 110, not depicted to scale, may have a high aspect ratio, for example about 6:1 or higher and a narrow width, for example about 90 nm or less. The gap may be defined by its boundaries, namely its bottom 104, sidewalls 106 and entry region (top) 108. The gaps 110/116 may be lined with a barrier layer, such as silicon nitride. A thin layer (e.g., 10-200 Å, for example 100 Å) of silicon nitride (112) is formed on the gap bottom 104 and sidewalls 106 prior to being filled with dielectric. Note that some semiconductor devices do not require a barrier layer liner for the gaps. A pad 114 exists next to the entry region 108, on the substrate surface surrounding the gap 110, and is also generally lined with the same barrier layer 112. Adjacent to each gap 110 are structures 102, which may be a silicon substrate lined with an oxide layer.

Figure 1B:
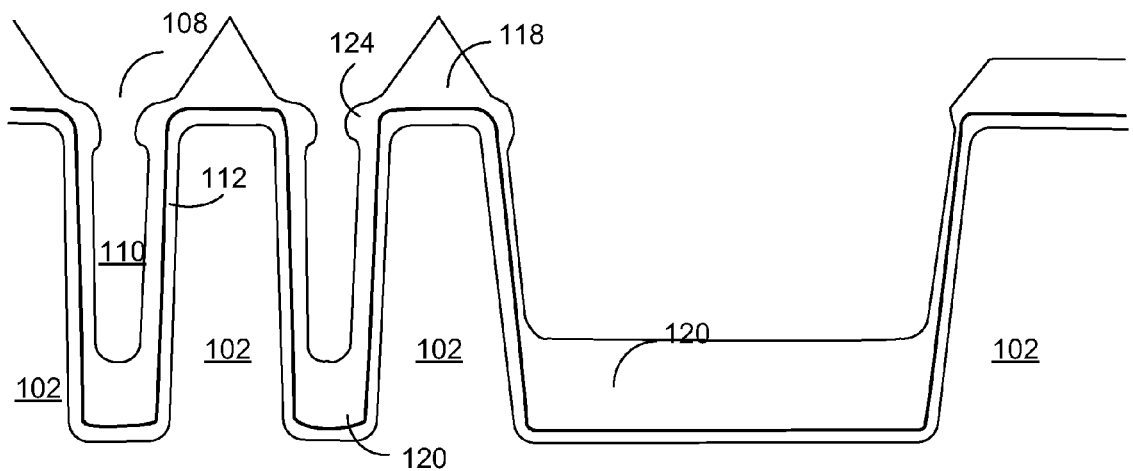

In certain embodiments, in an initial step in a multi-step gap fill process, the gaps 110/116 are partially filled with a dielectric 120 deposited by a high density plasma (HDP) chemical vapor deposition (CVD) process, as shown in FIG. 1B. The HDP CVD deposition performs bottom-up filling of the trench resulting in a thicker film on the bottom 104 than on the sidewalls. However, as described above, there is some problematic deposition resulting in an overhang 124 at the entry region 108 that further narrows access to the gap. Also, a top hat formation 118 forms on top of the pad on the surface adjacent to the gap opening. As noted above, the overhang results from the non-directional deposition reactions of neutral species in the plasma reactor and from sputtering/redeposition processes. Limitations due to overhang formation become ever more severe as the width of the gap to be filled decreases, the aspect ratio increases, and the features become reentrant.

Any suitable dielectric deposition chemistry may be used. The deposition chemistry will have a particular composition depending on flow rates of the constituent gases, process pressures, and volume of the reactor. In general, an HDP CVD process gas will include a precursor for the deposition layer. If the dielectric is a silicon-containing dielectric, then the process gas will include a silicon-containing compound such as silane, disilane, or other silicon precursor described below. The process gas will also generally include a carrier gas. The carrier gas may be an inert gas, such as helium, argon, and/or other noble gases. Or the carrier gas may be or include elemental or molecular hydrogen or deuterium. Oxygen used to react with the silicon-containing precursor or other dielectric precursor may be provided by the precursor itself or from another process gas such as elemental oxygen ($O_2$), nitric oxide (NO), nitrous oxide ($N_2O$), steam ($H_2O$), ozone ($O_3$) and/or peroxides like hydrogen peroxide ($H_2O_2$).

The process gas will include a precursor for the dielectric layer. If the dielectric is a silicon-containing dielectric, then the process gas will include a silicon-bearing compound such as $SiH_4$, $SiF_4$, $Si_2H_6$, TEOS (tetraethyl orthosilicate), TES (Tri-ethoxy Silane), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During the deposition process the silicon-containing reactant is decomposed to result in a silicon-containing film and volatile by-products.

Typical deposition process parameters for depositing a typical dielectric layer is as follows:

| | |
|---|---|
| $SiH_4$ flow rate (sccm) | 2-300 |
| $O_2$ flow rate (sccm) | 5-1000 |
| $H_2$ flow rate (sccm) | 0-5000 |
| He flow rate (sccm) | 0-2000 |
| Chamber Pressure (mTorr) | 0.2-500 |
| Wafer Temperature (° C.) | 0-900 |

Other oxygen and silicon-containing compounds listed above can be substituted for those listed in this table. Depending upon the atom counts in the precursor gases, the flow rate ranges may be changed. While there are no precise rules for modifying flow rates as a function of molecular structure, as an approximation the flow rate of the silicon-containing precursor may be reduced by a factor corresponding to the number of silicon atoms in the molecule. So, for example, if the molecule contains two silicon atoms, one may expect to reduce the flow rate of the silicon-containing precursor by halving the flow rate.

Note also that the presence of hydrogen in the process gas may require that the ratio of oxygen-containing precursor to silicon-containing precursor be adjusted upward (in comparison to a hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 100 sccm, and more preferably at least about 400 sccm, and most preferably at least about 500 sccm, based on a 200 millimeter substrate. Larger substrates require higher flow rates. The flow rate may vary somewhat when special gas injector configurations are employed.

The invention is also practiced with process gases containing noble gas (e.g., argon, neon, helium, krypton or xenon), with helium being preferred in most cases, either as the sole carrier gas, or in a mixture with hydrogen or other gases. The use of noble gases can be practiced under the conditions of the above-described embodiments, and their flow rate can be varied to modify the properties of the deposited dielectric film and to modulate the effect of other process gas components (e.g., hydrogen) on the deposition process.

For doped dielectrics (particularly silicon dioxide based dielectrics), the process gas may include a dopant precursor such as a boron-containing gas, a phosphorus-containing gas, a fluorine-containing gas, a carbon-containing gas, or a mixture thereof. In a specific embodiment, the gas includes one or more boron-containing reactants and one or more phosphorus-containing reactants and the dielectric film includes a boron- and phosphorous-doped silicon oxide glass (BPSG). Examples of suitable boron and phosphorus precursor gases include the following: diborane ($B_2H_6$) and phosphine ($PH_3$).

If the dielectric is to contain an oxyfluoride (e.g., silicon oxyfluoride), then the process gas preferably includes a fluorine-containing reactant such as silicon tetrafluoride ($SiF_4$) or nitrogen trifluoride ($NF_3$). If the dielectric is to contain an oxynitride (e.g., silicon oxynitride), then the process gas preferably includes a nitrogen-containing reactant such as nitrogen ($N_2$), ammonia ($NH_3$), nitrogen trifluoride ($NF_3$), nitric oxide (NO), nitrous oxide ($N_2O$), and mixtures thereof.

The method applies as well to the deposition (biased or unbiased) of carbon-doped silicon oxide from process gas mixtures including organosilanes (e.g., TEOS (tetraethyl orthosilicate), TES(Tri-ethoxy Silane) TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof.

During deposition, reactor pressure is held at a value necessary to sustain the optimum high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr, most preferably between about 1 and 30 mTorr.

The temperature of the wafer should be maintained sufficiently high to ensure that the dielectric deposition reaction proceeds efficiently. Hence, the temperature may be between about 30 and 1000° C. This temperature will vary depending upon the types of precursors employed in the reaction. Further, the temperature may be limited by process constraints, such as thermal budget limitations that preclude certain high temperatures, e.g., above 700-750° C. Such constraints become increasingly common with advanced technologies and corresponding smaller feature sizes. For such applications, the process temperature is preferably maintained between about 30 and 700° C. In particularly preferred embodiments, the substrate temperature is maintained between about 300 and 600° C., even more preferably between about 350 and 500° C.

As indicated, to control the substrate temperature, the substrate is supported on a substrate holder, or pedestal, that may have temperature control. The temperature control may be in the form of heater elements used to raise the temperature of the substrate and/or in the form of circulating fluid used to remove heat from or redistribute heat across the substrate. The reactor may also supply a heat transfer gas between a surface of the substrate and a surface of the substrate holder on which the substrate is supported during film deposition. The heat transfer gas may include helium or argon. The backside helium pressure is set by the temperature and heat transfer requirements of the process (a typical range being between 0-25 Torr depending on the bias power applied and the amount of contact cooling also present.).

For some applications, it may be desirable to preheat the wafer to a pre-specified temperature quickly and then maintain the temperature during deposition by cooling the wafer. The speed of the preheat is constrained by thermal stresses causing damage to the wafer, the amount of power available and throughput requirements. The goal is to maintain the wafer temperature within a narrow range (close to isothermal operation) during the entire deposition process.

The low frequency power applied to the upper electrode(s) (the induction coils for generating the plasma) typically varies from 1 kW to 20 kW, and the high frequency power (for biasing the substrate holder and wafer) typically reaches at least about 0.2 W/cm$^2$ (preferably varying from about 0.2 kW to 20 kW) depending on the substrate size (e.g., 200 or 300 mm diameter) and the requirements of the specific process being used.

The power source applied to the induction coils and the substrate electrode is typically a radio frequency (RF) bias. Applying radio frequency bias to the substrate involves supporting the substrate on a substrate holder having an electrode supplying a radio frequency bias to the substrate. For many embodiments, the radio frequency bias applied to the substrate is at the frequency range of between about 50 kHz and 100 MHz; the RF bias could be operated either in normal or pulse mode, with normal mode being used in the preferred embodiment. The frequency range applied to the induction coils is typically between about 50 kHz and 100 MHz, more typically about 200 kHz and 27 MHz.

In one embodiment, the dielectric deposition process chemistry is as follows:

| Gas | Flow Rate (sccm) |
| --- | --- |
| SiH$_4$ | 100 |
| H$_2$ | 400 |
| O$_2$ | 145 |
| He | 300 |

The low frequency induction coils are powered at 3000 W and the high frequency substrate electrode is powered at 2600 W.

Figure 1C:
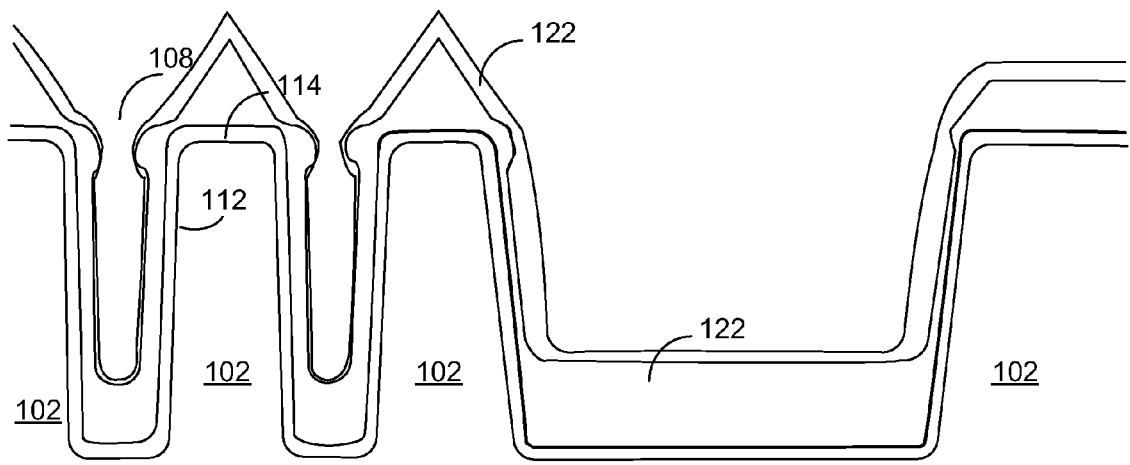

Referring to FIG. 1C, following the initial deposition of dielectric layer 120, a protective layer 122 is deposited. The protective layer 122 may be a dielectric layer that deposits thicker on sidewalls in the low-density region (isolated features) than on sidewalls in the high density region. The protective layer may be deposited using a PECVD or a PECVD-like process. PECVD uses one or more gaseous reactants to form a solid layer on the surface of a substrate enhanced by the use of a vapor containing electrically charged particles or plasma, at lower temperatures. As compared to HDP CVD, the plasma used is less dense, lacking the sputter-etch component. The chamber pressure may be higher; the bias and source power may be lower; and, the substrate temperature may be lower. PECVD process may be deposited in a separate PECVD chamber having one or more stations or an HDP CVD chamber may be used with PECVD process parameters.

Typical PECVD process parameters are as follows:

| | Parameter |
| --- | --- |
| TEOS | 0.7-17 ml/min |
| O$_2$ | 5-18 slm |
| HF Power at 13.56 MHz | 200-1000 W |
| LF Power at 400 kHz | 200-2200 W |
| Pressure | 1.6-3 Torr |
| Temperature | 200-400° C. |

The PECVD deposited protective layer may be a dielectric layer that has the same composition as the HDP CVD dielectric layer, particularly if some of the protective layer will be integrated into the trench fill. If the same material is used, the protective layer 122 may be deposited before or after the HDP CVD dielectric 120 during the iterative process. In some embodiments, a different dielectric layer may be used. The protective layer 122 may be selected based on its etch selectivity against subsequent etching processes, e.g., against fluorine etching and wet etching. Some or all of the protective layer 122 may be consumed in subsequent etching steps, reducing the importance of using same material as the HDP CVD dielectric layer.

In certain embodiments, an HDP CVD process having a lower sputter-deposition ratio (S/D), e.g., less than about 0.2, preferably less than about 0.1, may be used to deposit the protective layer 122. In other words, the rate of etching during the HDP CVD process is 15% or less of the rate of deposition. A low S/D HDP CVD process may be accomplished by reducing the flow of sputtering species gases and reducing the source power and/or the bias power so that the sputtering species ions impact the substrate surface with less energy.

Typical gas flow rate ranges and process parameters for low S/D protective layer deposition process of the present invention are listed below.

| Gas | Flow Rate (sccm) |
| --- | --- |
| SiH$_4$ | 2-300 |
| O$_2$ | 5-1000 |
| He | 0-2000 |
| H$_2$ | 0-5000 |
| Source power | 0.2-20 kW |
| Bias power | 0.2-20 kW |

The protective layer deposits thicker on the sidewalls of isolated features and thinner on the sidewalls of high density features due to the differing rates of redeposition. After the protective layer is deposited, the sidewall of the isolated feature may be thicker than the sidewall in the high density feature, as shown in FIG. 1C.

Next, the substrate is etched to remove unwanted top hat, overhang, and sidewall deposition in and around the high density feature. This thicker sidewall of isolated features allows a stronger etch to be used than if the protective layer was not deposited.

Figure 1D:
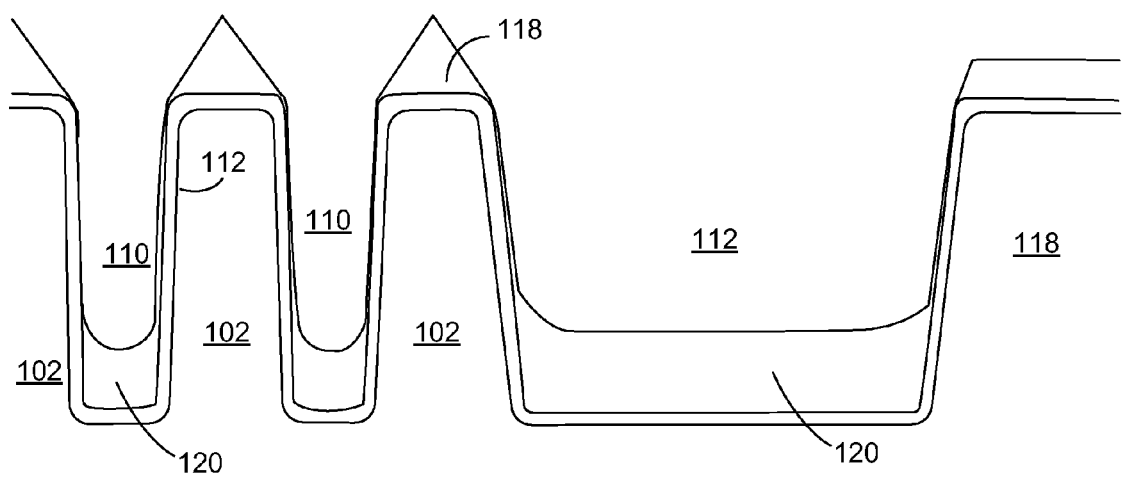

The etch step may comprise an isotropic, anisotropic, or a combination of both etch conditions using reactive chemistry. For example, the wafer is exposed to a downstream plasma or inductively-coupled plasma containing reactive chemistries. This reactive plasma etch step results in widening of the gap and reduction in top hat 118, thus reducing the aspect ratio of the partially filled gap, as illustrated in FIG. 1D, and facilitating further filling of the gap by subsequent HDP CVD dielectric deposition. This reactive plasma etch step also reduces the sidewall in the isolated feature and the high density feature, without damage the underlying structures.

In certain embodiments, the plasma etch process utilizes fluorine-based chemistry or other halogen-based chemistry. For example, an inductively-coupled plasma (ICP) configured reactor with up to 10 KW of delivered source power (e.g., about 2000 to 7000 W, or 3000 W), a biased and/or unbiased substrate holder, a process pressure of about 0.5-100 mTorr and a fluorine-based chemistry (e.g. $NF_3$) may be used. While $He/NF_3$-based chemistry is preferred in one embodiment of the invention, the etch step can be realized using other fluorine-containing compounds (e.g., $F_2$, HF, $C_2F_6$, $CF_4$, $SF_6$, etc) and carrier gases (e.g., Ar, He, $H_2$, $D_2$, $N_2$). Typical process parameter ranges for ICP etch process gases in accordance with the present invention and reactor conditions are listed below.

| | |
|---|---|
| $NF_3$ (sccm) | 5-5000 |
| He (sccm) | 0-5000 |
| $H_2$ | 0-2000 |
| Pressure (mTorr) | .5-100 |
| Source Power (W) | 1000-10000 |
| Bias Power (W) | 0-5000 |
| Time (s) | 1-120 |

In a preferred embodiment, the fluorine-based etch process chemistry is as follows:

| | |
|---|---|
| $NF_3$ (sccm) | 100 |
| He (sccm) | 500 |
| $H_2$ (sccm) | 1000 |
| Pressure (mTorr) | 12 |
| Source Power (W) | 3000 |
| Bias Power (W) | 500 |

The conditions are preferably set so that the primarily isotropic etch has higher selectivity to the protective layer relative to the HDP CVD deposited dielectric (e.g., $SiO_2$). It should also have higher selectivity to the silicon nitride barrier layer lining the trench relative to the HDP CVD deposited dielectric. As discussed above, the same or similar material may be used for the protective layer and the HDP CVD deposited dielectric; therefore, the etch selectivities may be similar also. In those cases, the thicker sidewall of the isolated feature would protect the underlying structure. Preferably, some, or most of the protective layer is consumed in the etch process so that any variance in material properties of the bulk dielectric and the protective layer would not adversely affect the performance of the device manufactured.

FIG. 1D shows the resulting layers after the reactive plasma etch. The size of top hat formations 118 is reduced. The overhangs 124 may be substantially removed, as well as deposits on the sidewalls of the gaps. Some of the bottom fill in the gaps may also be removed by the plasma etch. After etching the aspect-ratio of the high-density gaps should be reduced.

Figure 1E:
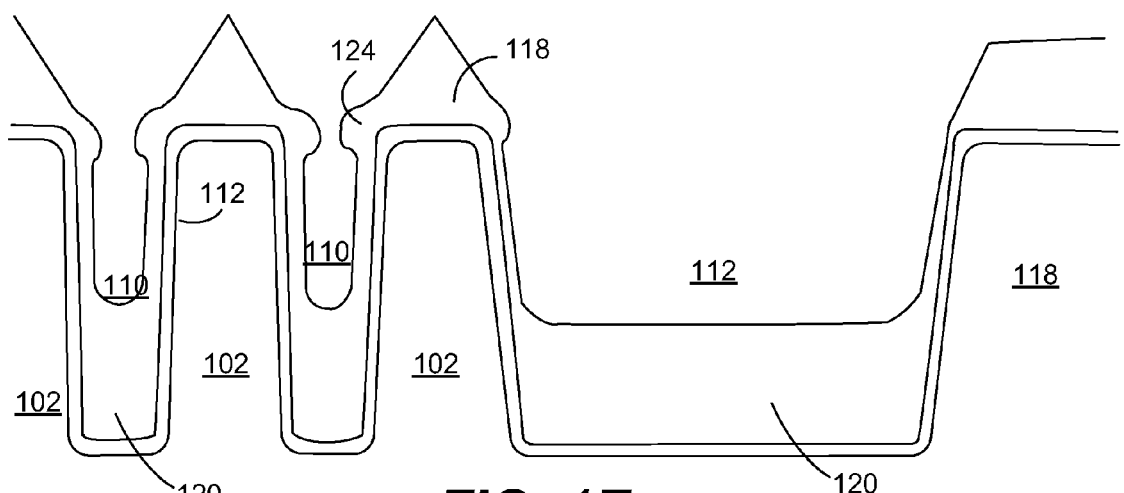
Figure 1F:
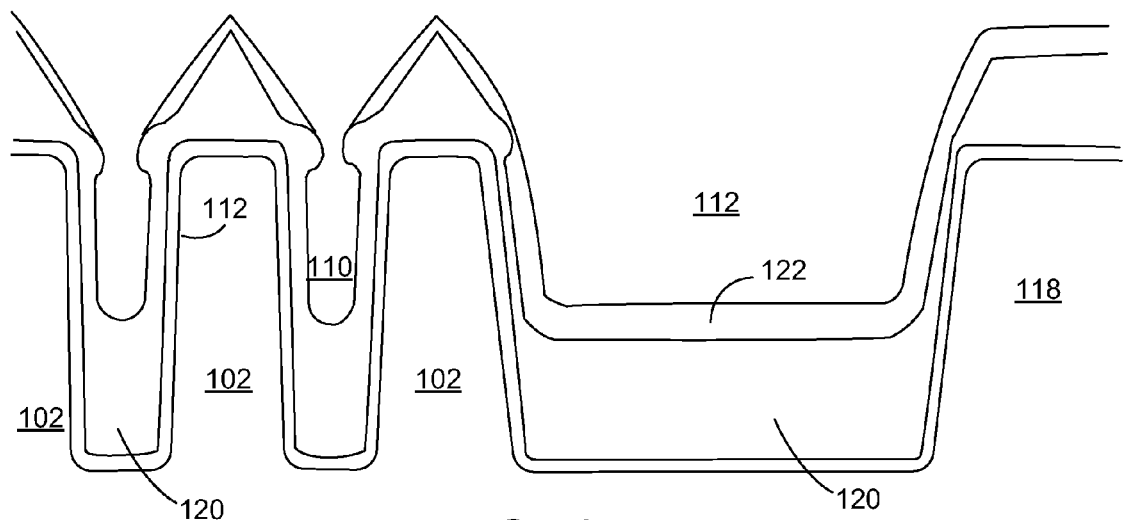
Figure 1G:
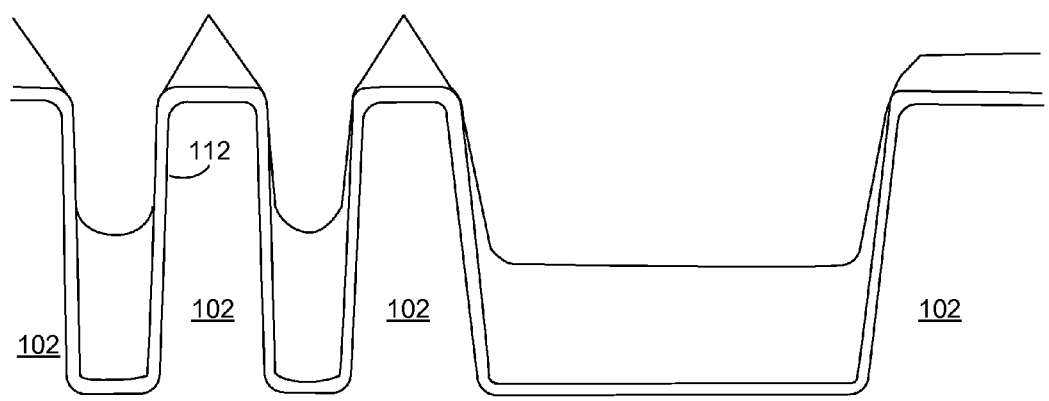
Figure 1H:
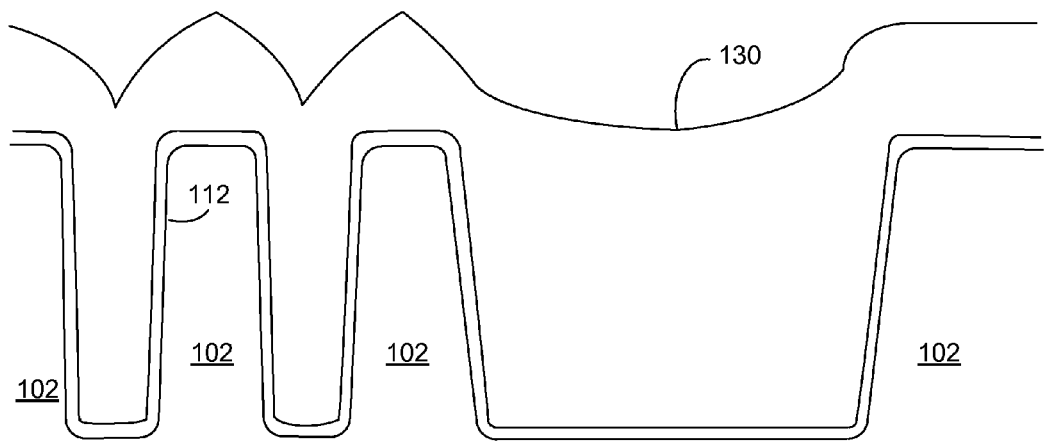

One or more additional HDP CVD deposition may be performed in order to further fill the remaining gap 110 with dielectric 120, as shown in FIG. 1E. In certain embodiments, only one more additional HPD CVD deposition may be performed to fill the gap 110, resulting in filled features as depicted in FIG. 1H. In other embodiments, the deposition of an HDP CVD layer, a protective layer, and etch back are then repeated until the gap is filled as depicted in FIGS. 1E-H.

In FIG. 1E, HDP CVD process deposits dielectric 120, which forms overhangs 124 and top hats 118. A protective layer 122 is then deposited, as shown in FIG. 1F. The substrate is then etched to reduce aspect ratio in the high-density gaps 110, as shown in FIG. 1G, before a final HDP CVD layer 130 is deposited to fill the gaps (FIG. 1H). For a gap with about a 6:1 aspect ratio and about a 1000 Å width, two or more iterations of the etch back and deposition of protective and dielectric layers are used to obtain void-free filling of the gap. Using a protective layer as described herein reduces the number of iteration as compared to processes without the protective layer. For example, four iterations may become two.

Figure 2A:
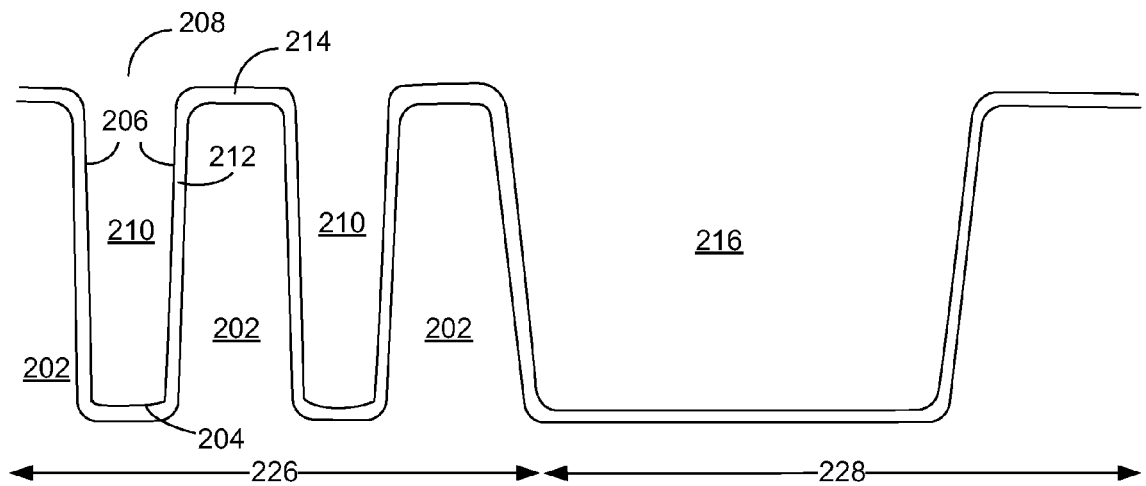
FIGS. 2A-F depict rough schematic cross-sectional diagrams of a multi-step gap fill process in accordance with the present invention.

In an alternate embodiment, only one protective layer is deposited. FIGS. 2A-F depict schematic cross-sectional diagrams of a multi-step deposition and etch back gap fill process utilizing only one protective layer. FIG. 2A depicts gaps (trenches) 210/216, each defined by its boundaries, namely its bottom 204, sidewalls 206 and entry region (top) 208. The gaps 210/216 may be lined with a thin layer of silicon nitride 212, forming a pad 214 next to the entry region 208. Structures 102 may be a silicon substrate lined with an oxide layer. A region of high feature density is shown as 226, with gaps 210 and associated structures. A region of lower feature density is shown as 228, with gap 216 and an associated structure.

Figure 2B:
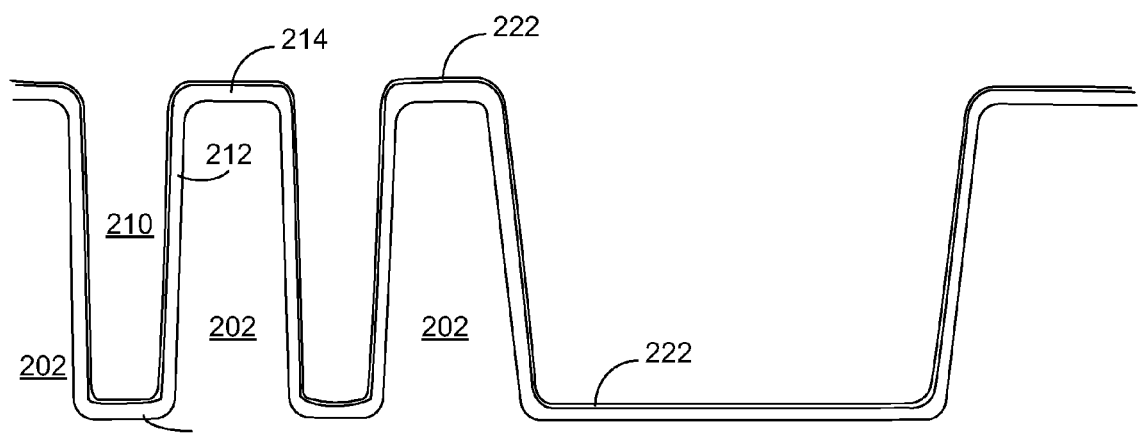

A protective layer 222 is deposited onto the barrier layer 212, as depicted in FIG. 2B. The protective layer 222 may be a thin layer dielectric material that is resistant or substantially impervious to subsequent plasma etch. The layer 222 may be 10-100 Å thick, preferably 10-50 Å, and even more preferably about 20 Å. The protective layer 222 may include a metallic oxide, e.g., a zirconium oxide ($ZrO_2$), an aluminum oxide ($Al_2O_3$), or a nitride, e.g., a boron nitride (BN), or a combination of one or more oxides and nitrides. The protective layer is preferably a conformal layer. Methods to deposit conformal protective layer includes the atomic layer deposition (ALD) and pulsed-deposition layer (PDL) processes. Non-conformal processes including PECVD, LPCVD, and other CVD processes, may also be used. Optionally, the protective layer 222 may be deposited without an underlying barrier layer 112.

The underlying protective layer 222, being resistant or substantially impervious to subsequent etch, can act as an etch stop and protect the underlying structures from being damaged. Some or all of the protective layer may be consumed by the subsequent etch steps. Given the parameters provided herein, one skilled in the art would be able to design a protective layer that is substantially consumed by the etch operations. Portions of the protective layer that are not consumed may be integrated into the filled gap. Zirconium oxide, aluminum oxide, and boron nitride may be capable of being integrated into the filled gap structure without adverse impact on device performance.

Figure 2C:
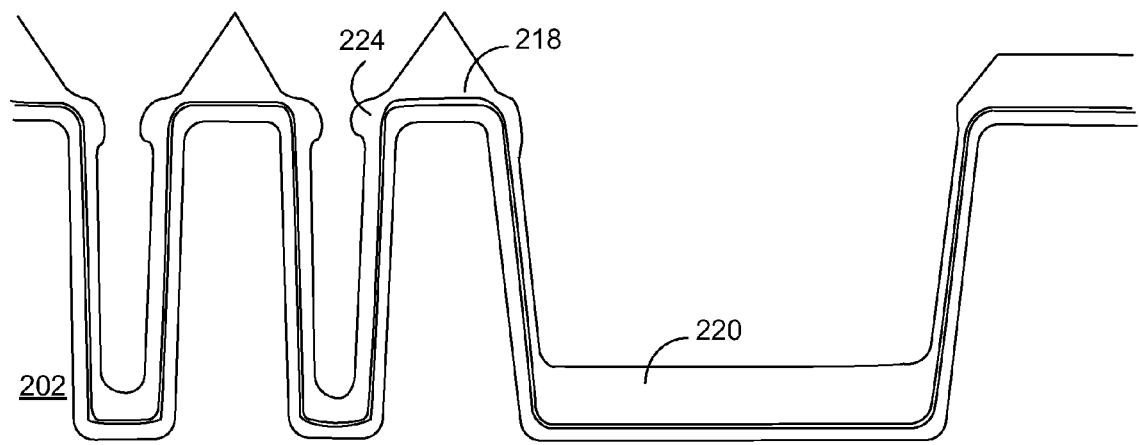
Figure 2D:
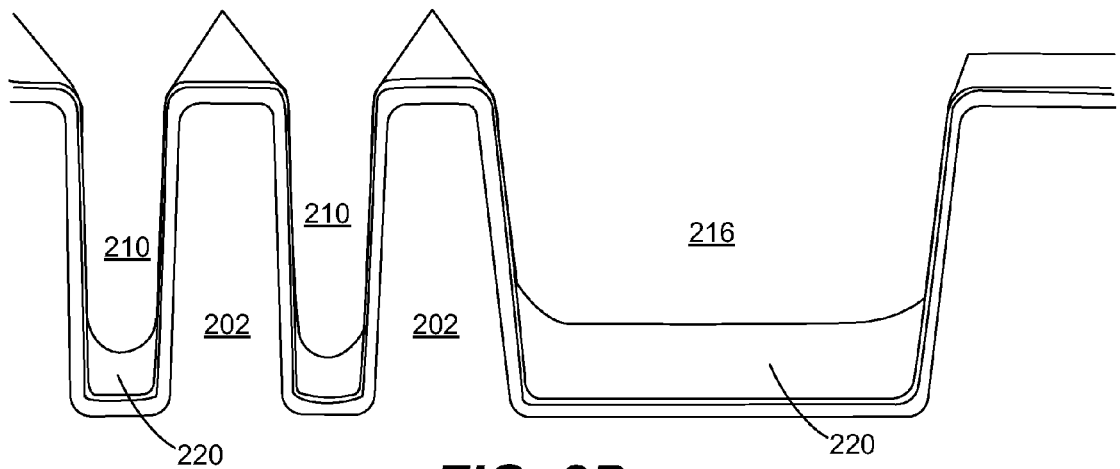

A dielectric layer 220 may be deposited using HDP CVD processes discussed above. The dielectric layer 220 forms top hats 218 and overhangs 224 and is thicker on the sidewalls in the high-density features than the isolated features, as shown in FIG. 2C. A portion of the dielectric layer 220 is then removed by reactive plasma etch to reduce the aspect-ratio of gaps 210. Preferably, the reactive plasma etch reduces the top hats, removes the overhangs and deposits on the sidewalls.

Figure 2E:
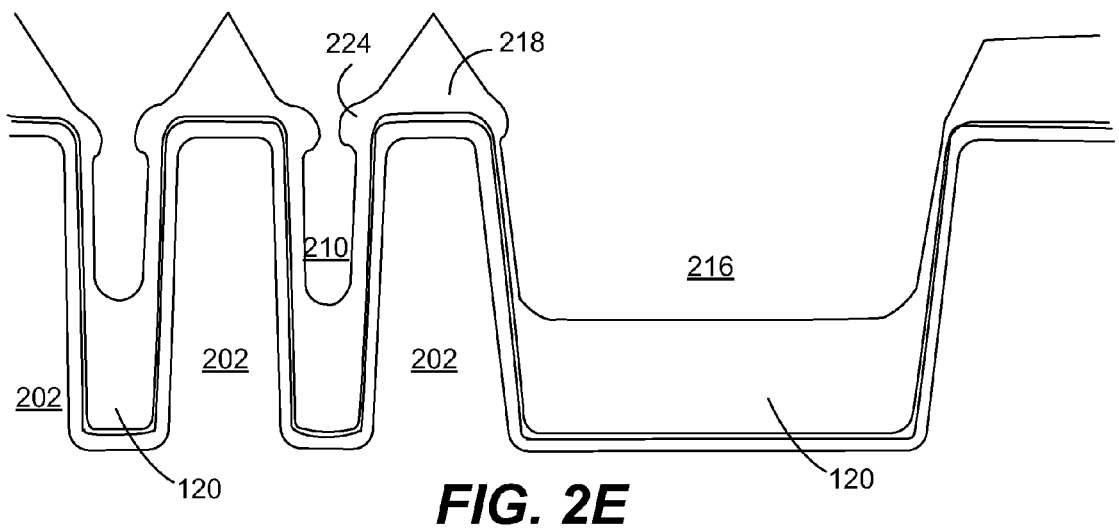
Figure 2F:
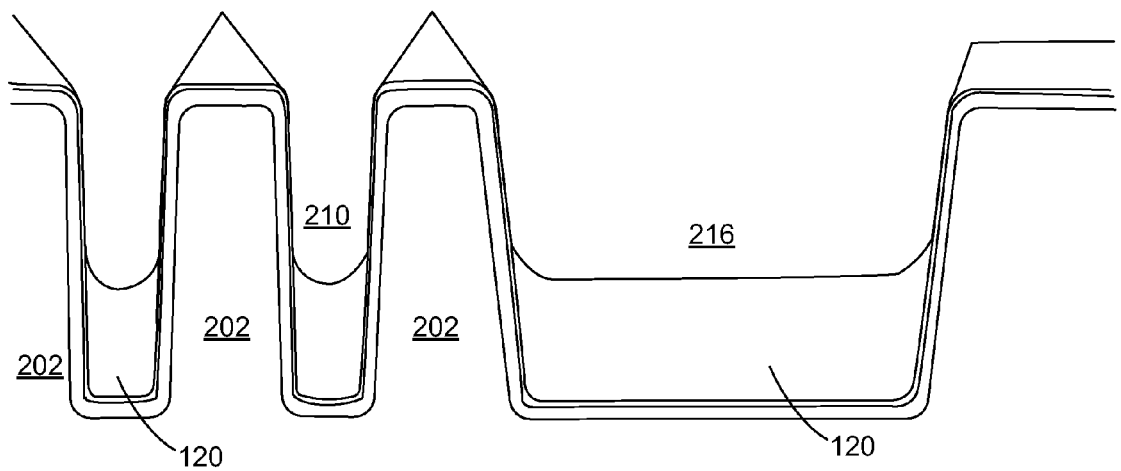

One or more HDP CVD depositions may be required to fill the gap. In certain embodiments, the reactive plasma etch renders the gap geometry to be such that one HDP CVD operation can fill the gap. In other embodiments, the deposition/etch operations may be repeated to completely fill the gaps. FIG. 2E-F depicts one example where one more iteration of deposition/etch is used. FIG. 2E shows the schematic after an HDP CVD deposition, again forming top hats 218 and overhangs 224.

The substrate may be etched again to reduce the aspect-ratio of the high-density gaps 210, as depicted in FIG. 2F. The deposition/etch process may be repeated until the dimensions of the gaps 210 are such that only one deposition operation would fill the gap.

In certain embodiments, a combination of the embodiments of FIG. 1 and 2 may be used. A first protective layer such as layer 222 of FIG. 2B may be deposited. Next, a second protective layer such as layer 122 of FIG. 1C and a dielectric gapfill layer such as layer 220 of FIG. 2C may be deposited, in any order. The first and second protective layers would protect the underlying structures from etching required to remove overhangs and tophats. The second protective layer would be designed to be removed during etching operations, the first protective layer would serve as further protection to broaden the process window.

Figure 3:
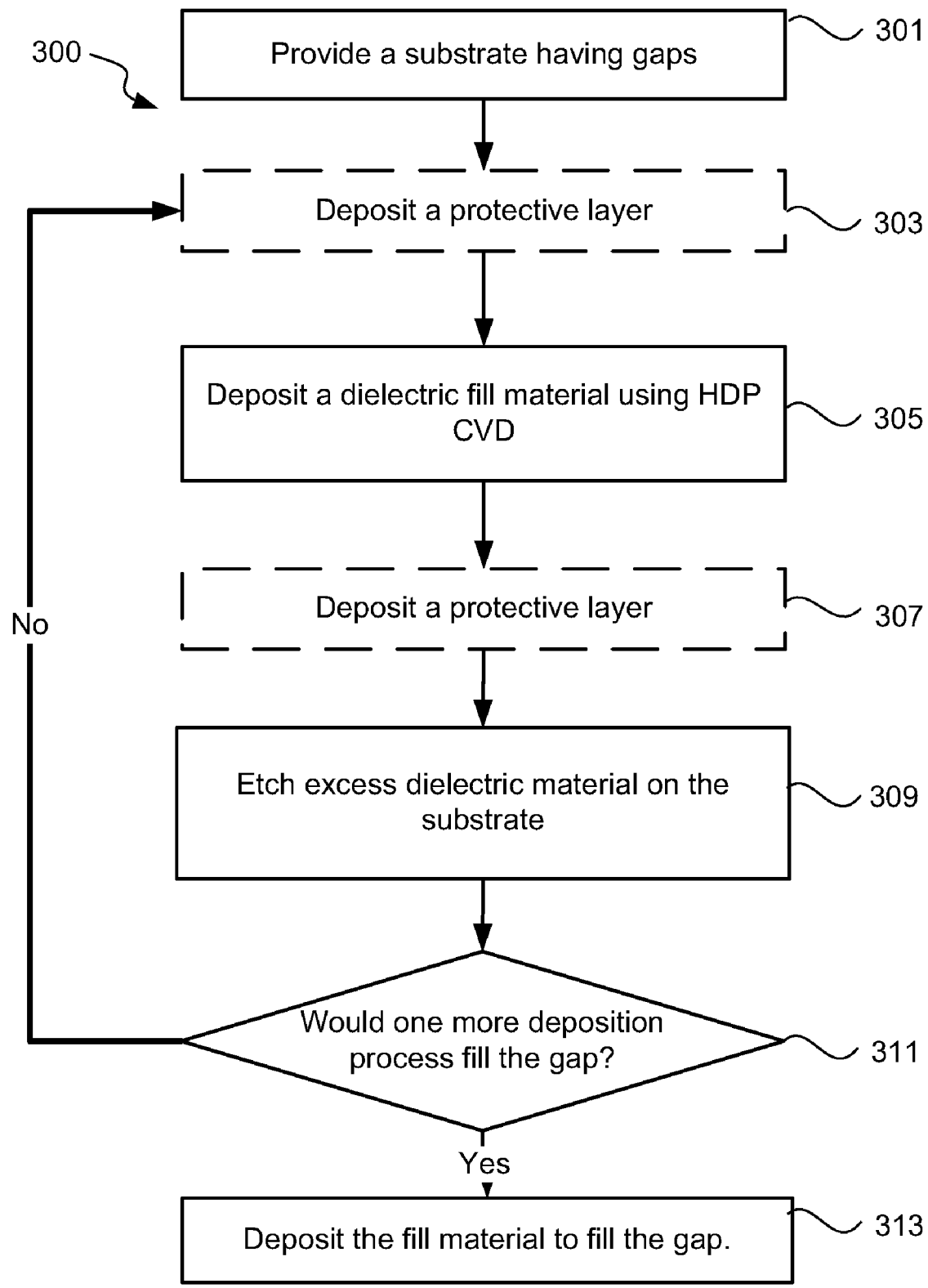
FIG. 3 is a process flow diagram depicting a process in accordance with the present invention.

FIG. 3 is a process flow diagram (300) depicting a process flow context of the present invention. A substrate with a feature requiring gapfill, such as a semiconductor wafer with a high-aspect-ratio gap, is provided in a semiconductor processing tool (301). Generally, the substrate include a thermal oxide layer on silicon and, optionally, a barrier layer such as silicon nitride.

A protective layer may be deposited on the substrate (303). In certain embodiments, the protective layer includes a metal oxide. In other embodiments, the protective layer is a dielectric layer deposited using PECVD or low S/D HDP CVD process.

A fill material is deposited (305), typically using a HDP CVD process. The fill material may be deposited in the same chamber or different chamber of the tool. The fill material forms an overhang structure partially blocking a gap opening. As explained above, the overhang structure reduces the angles of incidence with which deposition species must enter the gap to reach the bottom. Therefore, deposition at the bottom of the gap becomes less effective as the overhang grows.

After gap opening becomes partially blocked, a protective layer may be deposited, in operation 307. This protective layer may be a dielectric layer deposited using PECVD or low S/D HDP CVD process. The protective layer may be deposited even if a protective layer was previously deposited in operation 303. For example, a zirconium oxide protective layer may be deposited, followed by HDP CVD oxide, and then a low S/D HDP CVD protective layer. In other embodiments, a second protective layer may not be used after an initial zirconium oxide protective layer is deposited.

The substrate is etched (309) to reduce deposition on the surface of the substrate, e.g., top hats, and overhangs around the gap opening. Portions, may be all, of the deposition on the sidewalls may be removed by the etch. The etch process may be a reactive plasma etch, as described above, or other isotropic etch. The etch process may remove some or all of the protective layers. Generally, the etch would reduce the aspect ratio of the gaps and remove the partial block.

If one more deposition would fill the gap (311), then more fill material is deposited using the HDP CVD process to fill the gap (313). If not, then operations 303 to 309 repeat until only one more deposition can fill the gap. Operations 303 and 307 are optional depositions of protective layers. Each iteration of repeating operations 303 to 309 may perform 303 and 307 differently. For example, in some iterations, neither 303 or 309 may be performed. In other iterations, only 303 or only 309 may be performed. Still in other iterations, both 303 and 309 may be performed.

An example process sequence may be as follows: a substrate is provided (301), a zirconium oxide layer is deposited (303), a HDP CVD oxide is deposited (305), a PECVD oxide or low S/D HDP CVD oxide is deposited (307), the substrate is etched (309), a HDP CVD oxide is deposited (305), a low S/D HDP CVD oxide is deposited (307), the substrate is etched (309), a low S/D HDP CVD oxide is deposited (307), a HDP CVD oxide is deposited (305), the substrate is etched (309), and a final HDP CVD oxide is deposited to completely fill the gaps (313). In the foregoing example, two distinct protective layers are deposited before the deposition/etch operations are repeated. In the first repeat, a protective layer is deposited after the HDP CVD oxide, but in the second repeat, a protective layer is deposited before the HDP CVD oxide. Many more variations of these operations are possible within the scope of this invention to completely fill a gap without damaging underlying structures.

Implementation Systems

Figure 4:
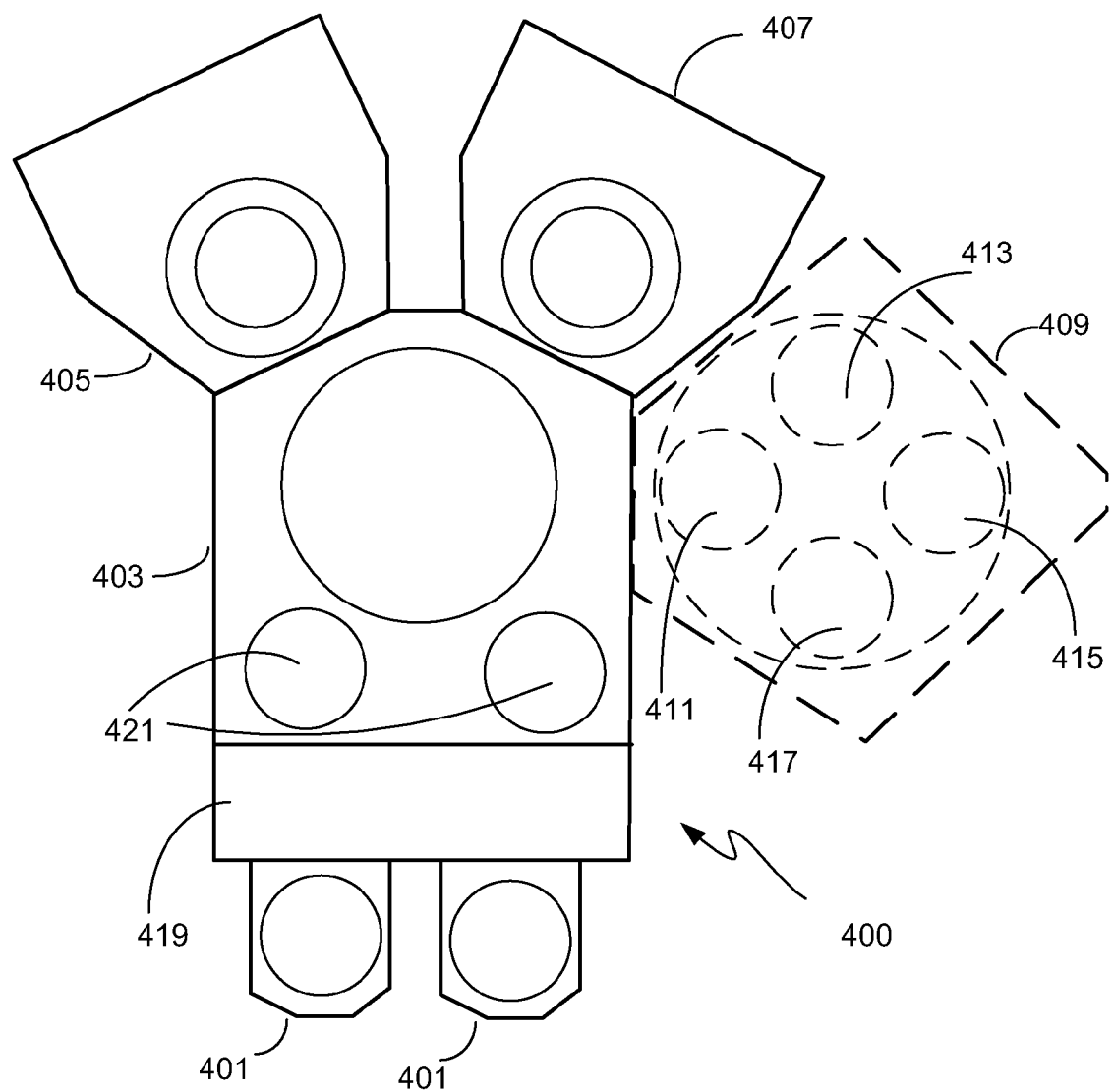
FIG. 4 is a block diagram of a plasma processing system suitable for conducting a multi-step gap fill process in accordance with the present invention.

FIG. 4 is a block diagram of a plasma processing system suitable for conducting a multi-step gap fill process in accordance with the present invention. The system 400 includes a transfer module 403, such as the wafer transfer system (WTS) used on the Speed platform available from Novellus Systems, Inc. of San Jose, Calif. The transfer module 403 provides a clean, pressurized environment to minimize the risk of contamination of substrates being processed as they are moved between the various processing stages. Mounted on the transfer module 403 are one or more HDP CVD modules 405, such as Novellus SPEED reactors, available from Novellus Systems, Inc. or the Ultima reactors, available from Applied Materials, Inc. of Santa Clara, Calif. The etch modules 407 may be a Novellus SPEED reactor, Novellus PEP IRIDIA DL strip and clean plasma reactor, Novellus INOVA xT preclean reactor, and Novellus atomic layer removal (ALR) reactor. These etch reactors may be mounted on the same or separate platforms as the deposition reactors, e.g., Applied Materials Centura and Producer, and Novellus Concept Two and Concept Three.

The system may optionally include a chamber 409 capable of performing PECVD, PDL or ALD process. Chamber 409 may include multiple stations 411, 413, 415, and 417 that may sequentially perform deposition or removal operations. The system 400 also includes one or more (in this case two) wafer source modules 401 where wafers are stored before and after processing. A device (generally a robot arm unit) in the transfer module 403 moves the wafers among the modules mounted on the transfer module 403

Wafers are transferred by the robot arm between the HDP CVD reactors 405 and/or the plasma etch reactor 407 for deposition and etch back processing, respectively. The robot arm may also transfer wafers between the protective layer deposition module 409 and the other chambers. In one embodiment, a single etch reactor can support two SPEED deposition modules 405 in this application with a high throughput of about 15-16 wafers per hour (wph). In other embodiments, two etch reactors 407 would support one or more SPEED deposition modules 405.

It should also be understood that, in the preferred embodiment, the present invention may also be practiced without a dedicated plasma etch chamber. For example, a single chamber may be configured for both HDP CVD deposition and reactive plasma etch. For example, the Novellus SPEED HDP-CVD reactors are capable of deposition and plasma etch in accordance with the present invention with a throughput similar to that of using separate reactors. Given the details and parameters provided herein, one of skill in the art would know how to configure a single chamber, for example, a plasma reactor, with equipment, for example the various plasma sources described herein, for deposition (HDP CVD) and reactive plasma etch (e.g., in-situ or downstream plasma source).

The foregoing describes implementation of the present invention in a single or multi-chamber semiconductor processing tool, capable of performing both deposition and etch processes sequentially.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A semiconductor processing method for filling high-aspect ratio gaps, the method comprising:
   (a) providing a substrate having a region of high feature density and a region of lower feature density;
   (b) depositing a protective layer over the features, wherein the protective layer prevents excess removal of an underlying structure of the features in the lower feature density region during a subsequent dry etching operation, wherein the protective layer is a dielectric layer that deposits thicker on the sidewalls of features in the lower density region than on the sidewalls of the features in the high density region;
   (c) after depositing the protective layer, depositing a dielectric layer to partially fill the high-aspect ratio gaps;
   (d) after depositing a dielectric layer, dry etching the substrate to remove deposition from the surface to reduce the aspect-ratio of the high-aspect ratio gaps in the high feature density region; and,
   (e) depositing a final dielectric layer to completely fill the gaps,
wherein the protective layer is deposited using a HDP CVD chamber operated under higher pressure, lower bias and source power and lower temperature than the dielectric deposition layer of operation (c).

2. The method of claim 1, further comprising repeating operations (b), (c), and (d) one or more times before operation (e).

3. The method of claim 1, wherein operations (b)-(e) occur in the same semiconductor processing tool.

4. The method of claim 1, wherein operations (b)-(e) occur in the same semiconductor processing chamber.

5. The method of claim 1, wherein operation (c) causes formations of overhang structures partially blocking the gap openings and etching in operation (d) removes said overhang.

6. The method of claim 1, wherein the protective layer is a dielectric layer deposited using a PECVD process.

7. The method of claim 1, wherein the protective layer is a dielectric layer deposited using a HDP CVD process having a sputter-deposition ratio of less than about 0.2.

8. The method of claim 1, wherein the protective layer is a dielectric layer deposited using a HDP CVD chamber under process conditions that mimic that of PECVD.

9. The method of claim 1, wherein the protective layer has a wet etch rate about equal to or less than that of a thermally grown silicon oxide.

10. The method of claim 1, wherein the protective layer is a dielectric layer that has resistance to fluorine etching.

11. The method of claim 1, wherein the high-aspect ratio is greater than about 6:1.

12. The method of claim 1, further comprising repeating operations (c), and (d) one or more times before operation (e).

13. The method of claim 1, further comprising depositing a second protective layer over the features, wherein the second protective layer is a metal oxide.

14. The method of claim 1 wherein said region of high feature density comprises a plurality of high aspect ratio gaps having openings of a first width and said region of lower feature density comprising at least one gap having an opening of a width greater than the first width.

15. The method of claim 2, wherein the one or more times is less than that of a method without operation (b).

16. The method of claim 2, wherein the one or more times is up to 50% less than that of a method without operation (b).

17. The method of claim 10, wherein the protective layer is a metal oxide that is compatible with operation of a semiconductor device to be created.

18. A semiconductor processing method for filling high-aspect ratio gaps, the method comprising:
   (a) providing a substrate having a region of high feature density and a region of lower feature density;
   (b) depositing a protective layer over the features, wherein the protective layer prevents excess removal of an underlying structure of the features in the lower feature density region during a subsequent dry etching operation, wherein the protective layer is a dielectric layer that deposits thicker on the sidewalls of features in the lower density region than on the sidewalls of the features in the high density region;
   (c) depositing a dielectric layer to partially fill the high-aspect ratio gaps;
   (d) after depositing a dielectric layer, dry etching the substrate to remove deposition from the surface to reduce the aspect-ratio of the high-aspect ratio gaps in the high feature density region;
   (e) depositing a final dielectric layer to completely fill the gaps, wherein (c) occurs before (b); and
   further comprising repeating operations (c), (b), and (d) one or more times before operation (e).

19. A semiconductor processing method for filling high-aspect ratio gaps, the method comprising:
   (a) providing a substrate having a region of high feature density and a region of lower feature density;
   (b) depositing a first protective layer over the features, wherein the protective layer prevents excess removal of an underlying structure of the features in the lower feature density region during a subsequent dry etching operation;

(c) after depositing the first protective layer, depositing a second protective layer and depositing a dielectric layer to partially fill the high-aspect ratio gaps;

(d) after depositing a dielectric layer, dry etching the substrate to remove deposition from the surface to reduce the aspect-ratio of the high-aspect ratio gaps in the high feature density region; and, (e) depositing a final dielectric layer to completely fill the gaps;

wherein the first protective layer is selected from the group consisting of a zirconium oxide ($ZrO_2$), an aluminum oxide ($Al_2O_3$), a boron nitride (BN), and combinations thereof and wherein the second protective layer is a dielectric layer that deposits thicker in features in the lower density region than features in the high density region.

20. The method of claim 19, wherein the first protective layer is a zirconium oxide ($ZrO_2$) deposited using an ALD process.

21. The method of claim 19, wherein the first protective layer is an aluminum oxide ($Al_2O_3$) deposited using an ALD or PDL process.

22. A semiconductor processing method to protect structures underlying isolated features during etching:

(a) providing a substrate having a region of high feature density and a region of lower feature density, wherein the features in the region of lower feature density have openings wider than those of the features in the region of high feature density;

(b) depositing a protective layer over the features;

(c) depositing a HDP-CVD dielectric layer to partially fill the high-aspect ratio features, wherein the deposition causes formation of overhang structures partially blocking the feature openings;

(d) etching the substrate to remove deposition from the surface and overhangs to reduce the aspect-ratio of the features in the high feature density region; and, (e) depositing a final dielectric layer to completely fill the feature, wherein the etching removes some or all of the protective layer, substantially none of the bottom portion of the partial fill, and does not damage the underlying feature structures.

23. A semiconductor processing method for filling high-aspect ratio gaps, the method comprising:

(a) providing a substrate having a region of high feature density and a region of lower feature density;

(b) depositing a protective layer over the features, wherein the protective layer prevents excess removal of an underlying structure of the features in the lower feature density region during a subsequent dry etching operation, wherein the protective layer is a dielectric layer that deposits thicker on the sidewalls of features in the lower density region than on the sidewalls of the features in the high density region;

(c) after depositing the protective layer, depositing a dielectric layer to partially fill the high-aspect ratio gaps;

(d) after depositing a dielectric layer, dry etching the substrate to remove deposition from the surface to reduce the aspect-ratio of the high-aspect ratio gaps in the high feature density region; and, (e) depositing a final dielectric layer to completely fill the gaps, wherein the protective layer is deposited using under higher pressure and lower temperature than the dielectric deposition layer of operation (c).

* * * * *